US007603156B2

(12) United States Patent
Gurr et al.

(10) Patent No.: US 7,603,156 B2
(45) Date of Patent: Oct. 13, 2009

(54) SYSTEMS AND METHODS FOR PHASE ENCODE PLACEMENT

(75) Inventors: David Henry Gurr, Milwaukee, WI (US); Jean Helen Brittain, Menlo Park, CA (US); Graham Arnold Wright, Toronto (CA)

(73) Assignee: GE Medical Systems Global Technology Co., LLC, Waukesha, WI (US)

( * ) Notice: Subject to any disclaimer, the term of this patent is extended or adjusted under 35 U.S.C. 154(b) by 705 days.

(21) Appl. No.: 10/613,580

(22) Filed: Jul. 2, 2003

(65) Prior Publication Data

US 2005/0004448 A1 Jan. 6, 2005

(51) Int. Cl.
*A61B 5/05* (2006.01)
(52) U.S. Cl. ...................... 600/410; 600/407
(58) Field of Classification Search ........... 600/407, 600/410; 382/276, 277, 280, 293, 300; 324/307, 324/309
See application file for complete search history.

(56) References Cited

U.S. PATENT DOCUMENTS

| 4,710,717 A | 12/1987 | Pelc et al. | |
|---|---|---|---|
| 4,727,325 A * | 2/1988 | Matsui et al. | 324/309 |
| 5,122,747 A | 6/1992 | Riederer et al. | |
| 5,245,282 A | 9/1993 | Mugler, III et al. | |
| 5,377,680 A | 1/1995 | Bernstein et al. | |
| 5,500,593 A * | 3/1996 | Loncar et al. | 324/307 |
| 5,532,595 A * | 7/1996 | Lampman et al. | 324/309 |
| 5,722,409 A * | 3/1998 | Kuhara et al. | 600/410 |
| 5,892,358 A * | 4/1999 | King | 324/309 |
| 6,023,635 A | 2/2000 | Liu et al. | |
| 6,043,654 A | 3/2000 | Liu et al. | |
| 6,068,595 A * | 5/2000 | Miyazaki et al. | 600/410 |
| 6,073,042 A * | 6/2000 | Simonetti | 600/420 |
| 6,144,873 A | 11/2000 | Madore et al. | |
| 6,144,874 A * | 11/2000 | Du | 600/413 |
| 6,230,040 B1 | 5/2001 | Wang et al. | |
| 6,255,820 B1 * | 7/2001 | Steckner | 324/309 |
| 6,288,542 B1 | 9/2001 | Proksa et al. | |
| 6,288,544 B1 | 9/2001 | Bernstein et al. | |
| 6,353,752 B1 | 3/2002 | Madore et al. | |
| 6,404,194 B1 | 6/2002 | Irarrazabal et al. | |
| 6,411,089 B1 * | 6/2002 | Anand et al. | 324/309 |
| 6,414,487 B1 * | 7/2002 | Anand et al. | 324/309 |
| 6,424,153 B1 | 7/2002 | Liu et al. | |
| 6,486,670 B2 * | 11/2002 | Heid | 324/307 |
| 6,487,435 B2 | 11/2002 | Mistretta et al. | |

(Continued)

FOREIGN PATENT DOCUMENTS

EP        0627633 A1     12/1994

OTHER PUBLICATIONS

Edelstein, W.A., "Spin Warp NMR Imaging and Applications to Human Whole-body Imaging", Letters to the Editor, May 12, 1980, pp. 751-756.

(Continued)

*Primary Examiner*—Brian Casler
*Assistant Examiner*—James Kish
(74) *Attorney, Agent, or Firm*—Armstrong Teasdale LLP

(57) ABSTRACT

A method for a medical examination is described. The method includes polar phase encoding to generate a plurality of signals forming datasets representative of an object, where the datasets form a grid in polar coordinates in a k-space.

25 Claims, 7 Drawing Sheets

U.S. PATENT DOCUMENTS

| | | | | |
|---|---|---|---|---|
| 6,515,477 B1 * | 2/2003 | Tasaka et al. | | 324/309 |
| 6,518,759 B2 | 2/2003 | Bernstein | | |
| 6,591,128 B1 * | 7/2003 | Wu et al. | | 600/422 |
| 6,653,834 B2 * | 11/2003 | Beck et al. | | 324/309 |
| 6,794,869 B2 * | 9/2004 | Brittain | | 324/309 |
| 6,828,788 B2 * | 12/2004 | Wang | | 324/309 |
| 7,003,343 B2 * | 2/2006 | Watts et al. | | 600/410 |
| 7,064,546 B2 * | 6/2006 | Feiweier | | 324/307 |
| 2001/0041819 A1 * | 11/2001 | Goto | | 600/9 |
| 2002/0175683 A1 * | 11/2002 | Mertelmeier et al. | | 324/314 |

OTHER PUBLICATIONS

Netherlands Foreign Search Report; Apr. 21, 2006; 3 pages.

Lauzon, M., et al.; "Polar Sampling in k-Space: Reconstruction Effects;" Magnetic Resonance in Medicine 40; Nov. 1998; pp. 769-782.

Adalsteinsson, E., et al.; "Volumetric Spectroscopic Imaging with Spiral-Based k-Space Trajectories;" Magnetic Resonance in Medicine 39; Jun. 1998; pp. 889-893.

Pauly, J., et al.; "A k-Space Analysis of Small-Tip-Angle Excitation;"Journal of Magnetic Resonance 81; Jan. 1989; pp. 43-56.

* cited by examiner

SYSTEMS AND METHODS FOR PHASE ENCODE PLACEMENT

BACKGROUND OF THE INVENTION

This invention relates generally to medical imaging systems, and more particularly to systems and methods for polar phase encoding for magnetic resonance imaging (MRI):

When a substance such as human tissue is subjected to a uniform magnetic field (polarizing field $B_o$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "dipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received nuclear magnetic resonance (NMR) signals are digitized and processed to reconstruct the image using one of many well known reconstruction techniques.

A variant of the well known Fourier transform (FT) imaging technique is frequently referred to as "spin-warp". The spin-warp technique is discussed in an article entitled "Spin-Warp NMR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of NMR spin-echo signals to phase encode spatial information in the direction of this gradient. In a 2-dimensional implementation (2DFT), for example, spatial information is encoded in one direction by applying a phase encoding gradient ($G_x$) along that direction, and then a spin-echo signal is acquired in the presence of a readout magnetic field gradient ($G_z$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_x$ is incremented ($\Delta G_x$) in the sequence of views that are acquired during the scan to produce a set of NMR data from which an entire image can be reconstructed.

In a 3-dimensional implementation of the spin-warp method phase encoding of the spin-echo signals is performed along two orthogonal axes. As described in U.S. Pat. No. 4,431,968 entitled "Method of 3-dimensional NMR Imaging Using Selective Excitation," a thick slab of spins is excited by applying a slab-selection gradient ($G_y$) in the presence of a selective RF excitation pulse and then a first phase encoding gradient ($G_y$) along the same axis and a second phase encoding gradient ($G_x$) are applied before the NMR signal acquisition in the presence of a readout gradient ($G_z$). For each value of the $G_x$ phase encoding gradient, the $G_y$ phase encoding is stepped through all its values to sample a 3-dimensional region of k-space. By selectively exciting a slab, NMR signals are acquired from a controlled 3-dimensional volume.

BRIEF DESCRIPTION OF THE INVENTION

In one aspect, a method for a medical examination is described. The method includes polar phase encoding to generate a plurality of signals forming datasets representative of an object, where the datasets form a grid in polar coordinates in a k-space.

In another aspect, a magnetic resonance (MR) method for medical examinations is described. The MR method includes injecting a patient with a contrast agent that flows into a vasculature of the patient, acquiring MR signals produced by spins in the vasculature from an MR imaging system, and polar phase encoding to generate the MR signals forming datasets representative of the patient, wherein the datasets form a grid in polar coordinates in a k-space.

In yet another aspect, a method for a medical examination is described. The method includes sampling datasets on to a grid of polar coordinates in a k-space to generate signals representative of an object of interest that is being medically examined.

In still another aspect, a magnetic resonance imaging (MRI) system is described. The MRI system includes a main magnet to generate a uniform magnetic field, a radio frequency pulse generator for exciting the magnetic field, a gradient field generator for generating gradients extending in different directions in the magnetic field, a receiver for receiving magnetic field magnetic resonance (MR) signals representative of an object, and a controller for polar phase encoding to generate the MR signals forming datasets representative of the object, where the datasets form a grid in polar coordinates in a k-space.

In another aspect, a controller is described. The controller is programmed to polar phase encode to generate a plurality of MR signals forming datasets representative of an object, where the datasets form a grid in polar coordinates in a k-space.

DETAILED DESCRIPTION OF THE INVENTION

Figure 1:
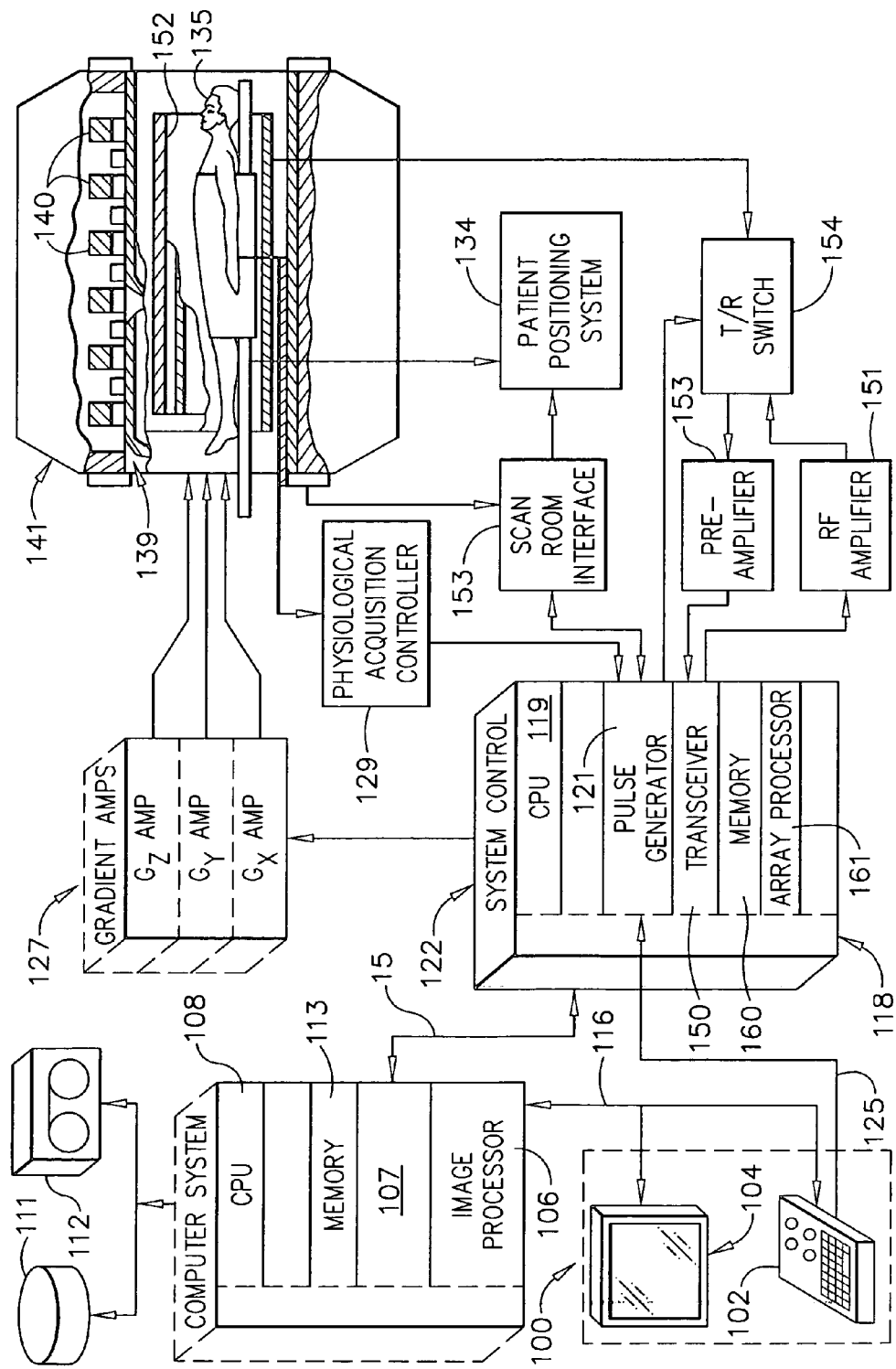
FIG. 1 is a block diagram of an embodiment of a magnetic resonance imaging (MRI) system in which the herein described systems and methods for polar phase encode placement are implemented.

FIG. 1 is a block diagram of an embodiment of a magnetic resonance imaging (MRI) system in which the herein described systems and methods for polar phase encode placement are implemented. The operation of the system is controlled from an operator console 100 which includes a keyboard and control panel 102 and a display 104. Console 100 communicates through a link 116 with a separate computer system 107 that enables an operator to control the production and display of images on the screen 104. Computer system 107 includes a number of modules which communicate with each other through a backplane. These include an image processor module 106, a central processing unit (CPU) module 108 and a memory module 113, known in the art as a frame buffer for storing image data arrays. Computer system 107 is linked to a disk storage 111 and a tape drive 112 for storage of image data and programs, and it communicates with a separate system control 122 through a high speed serial link 115.

System control 122 includes a set of modules connected together by a backplane 118. These include a CPU module 119 and a pulse generator module 121 which connects to operator console 100 through a serial link 125. It is through link 125 that system control 122 receives commands from the operator which indicate the scan sequence that is to be performed. Pulse generator module 121 operates the system components to carry out the desired scan sequence. It produces data which indicates the timing, strength and shape of the radio frequency (RF) pulses which are to be produced, and the timing of and length of the data acquisition window. Pulse generator module 121 connects to a set of gradient amplifiers 127, to indicate the timing and shape of the gradient pulses to be produced during the scan. Pulse generator module 121 also receives patient data from a physiological acquisition controller 129 that receives signals from a number of different sensors connected to a patient 135, such as electrocardiogram (ECG) signals from electrodes or respiratory signals from a bellows. And finally, pulse generator module 121 connects to a scan room interface circuit 133 which receives signals from various sensors associated with the condition of patient 135 and a magnet assembly 141. It is also through scan room interface circuit 133 that a patient positioning system 134 receives commands to move patient 135 to the desired position for the scan. It is noted that an object, such as a phantom, can be used instead of patient 135.

The gradient waveforms produced by pulse generator module 121 are applied to a gradient amplifier system 127 comprised of $G_x$, $G_y$, and $G_z$ amplifiers. Each gradient amplifier excites a corresponding gradient coil in an assembly generally designated 139 to produce the magnetic field gradients used for position encoding acquired signals. Gradient coil assembly 139 forms part of magnet assembly 141 which includes a polarizing magnet 140 and a whole-body RF coil 152. A transceiver module 150 in system control 122 produces pulses which are amplified by an RF amplifier 151 and coupled to RF coil 152 by a transmit/receive switch 154. The resulting signals radiated by the excited nuclei in patient 135 may be sensed by RF coil 152 and coupled through the transmit/receive switch 154 to a preamplifier 153. The amplified NMR signals are demodulated, filtered, and digitized in the receiver section of transceiver 150. Transmit/receive switch 154 is controlled by a signal from pulse generator module 121 to electrically connect RF amplifier 151 to the coil 152 during the transmit mode and to connect preamplifier 153 during the receive mode. Transmit/receive switch 154 also enables a separate RF coil (for example, a head coil or surface coil) to be used in either the transmit or receive mode.

The NMR signals picked up by RF coil 152 are digitized by transceiver module 150 and transferred to a memory module 160 in system control 122. When the scan is completed and an entire array of data has been acquired in memory module 160, an array processor 161 operates to Fourier transform the data into an array of image data. This image data is conveyed through serial link 115 to computer system 107 where it is stored in disk memory 111. In response to commands received from operator console 100, this image data may be archived on tape drive 112, or it may be further processed by image processor 106 and conveyed to operator console 100 and presented on display 104.

Figure 2:
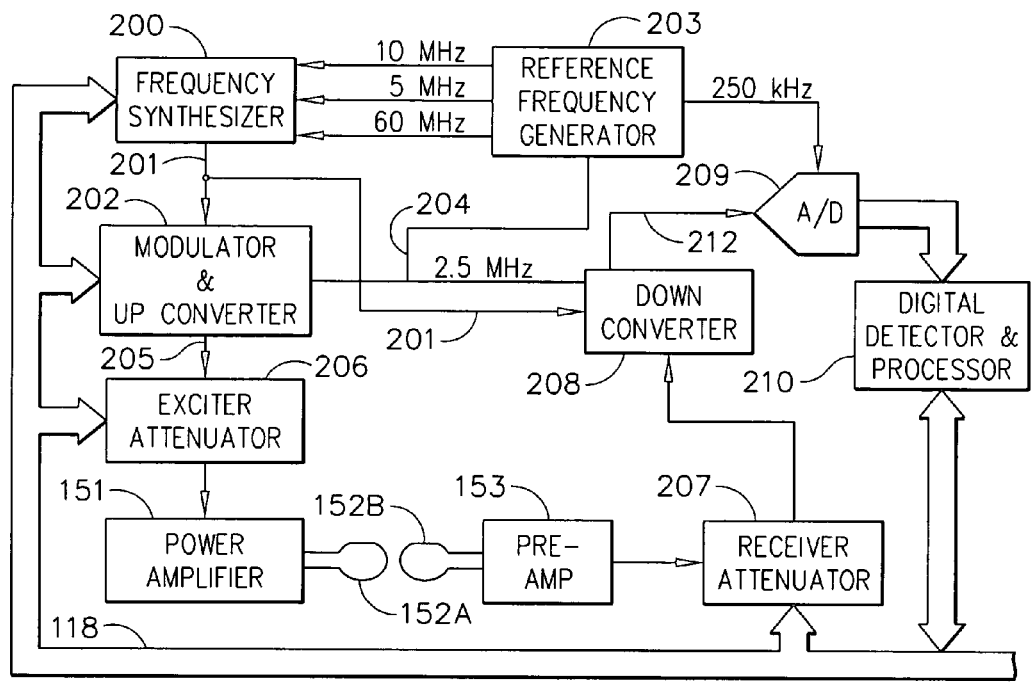
FIG. 2 is a block diagram of a transceiver that forms a part of the MRI system of FIG. 1.

Referring particularly to FIGS. 1 and 2, transceiver 150 produces the RF excitation field $B_I$ through power amplifier 151 at a coil 152A and receives the resulting signal induced in a coil 152B. As indicated above, coils 152A and B may be separate as shown in FIG. 2, or they may be a single whole-body coil as shown in FIG. 1. The base, or carrier, frequency of the RF excitation field is produced under control of a frequency synthesizer 200 which receives a set of digital signals from CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in module 121 by sequentially reading out a series of stored digital values. These stored digital values may, in turn, be changed from operator console 100 to enable any desired RF pulse envelope to be produced.

The magnitude of the RF excitation pulse produced at output 205 is attenuated by an exciter attenuator circuit 206 which receives a digital command from backplane 118. The attenuated RF excitation pulses are applied to power amplifier 151 that drives RF coil 152A.

The signal produced by patient 135 is picked up by receiver coil 152B and applied through preamplifier 153 to the input of a receiver attenuator 207. Receiver attenuator 207 further amplifies the signal by an amount determined by a digital attenuation signal received from backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied via line 212 to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal.

Figure 3:
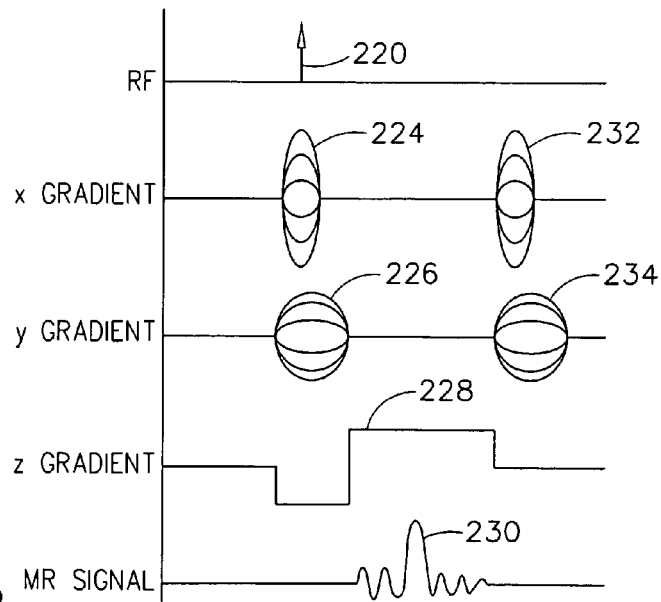
FIG. 3 is a graphic representation of a pulse sequence employed in the MRI system of FIG. 1 to practice an embodiment of a method for polar phase encode placement.

Although the systems and methods for polar phase encode placement can be used with a number of different pulse sequences, an embodiment of the invention employs a 3-dimensional (3D) gradient recalled echo pulse sequence depicted in FIG. 3.

Referring particularly to FIG. 3, an RF excitation pulse 220 is produced to produce transverse magnetization in a 3D volume. RF excitation pulse 220 is followed by a phase encoding gradient pulse 224 directed along the x axis and a phase encoding gradient pulse 226 directed along the y axis. A readout pulse 228 directed along the z axis follows and an echo NMR signal 230 is acquired and digitized as described above. As used herein, echo refers to any one of a partial echo and a full echo. After the acquisition, rewinder gradient pulses 232 and 234 rephase the magnetization before the pulse sequence is repeated.

The pulse sequence is repeated and phase encoding pulses 224 and 226 are stepped through a series of values to sample the 3D k-space. In an embodiment, 256×128 phase encodings are employed by acquiring 256 phase encodes at a projection angle, acquiring 256 phase encodes at another projection angle, and repeating the acquiring for 128 projection angles. As will become apparent from the discussion below, the order in which this k-space sampling is performed is an important aspect of the systems and methods for polar phase encode placement.

One aspect of an embodiment of a system and method for polar phase encode placement is that datasets are sampled on to a grid of polar coordinates. Another aspect of an embodiment of a system and method for polar phase encode placement is the location in which k-space is sampled using the pulse sequence in FIG. 3. The sampling of k-space is performed by stepping the magnitude of x and y phase encoding pulses 224 and 226 respectively through a sequence of values and the order in which this is done determines how k-space is sampled during the scan.

Figure 4:
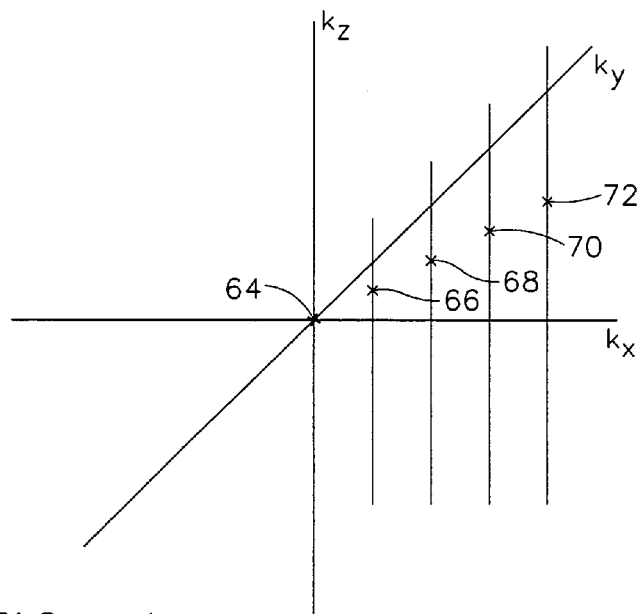
FIG. 4 illustrates an embodiment of a method for polar phase encode placement with phase encoding in $k_x$ and $k_y$ and frequency encoding in $k_z$.
Figure 5:
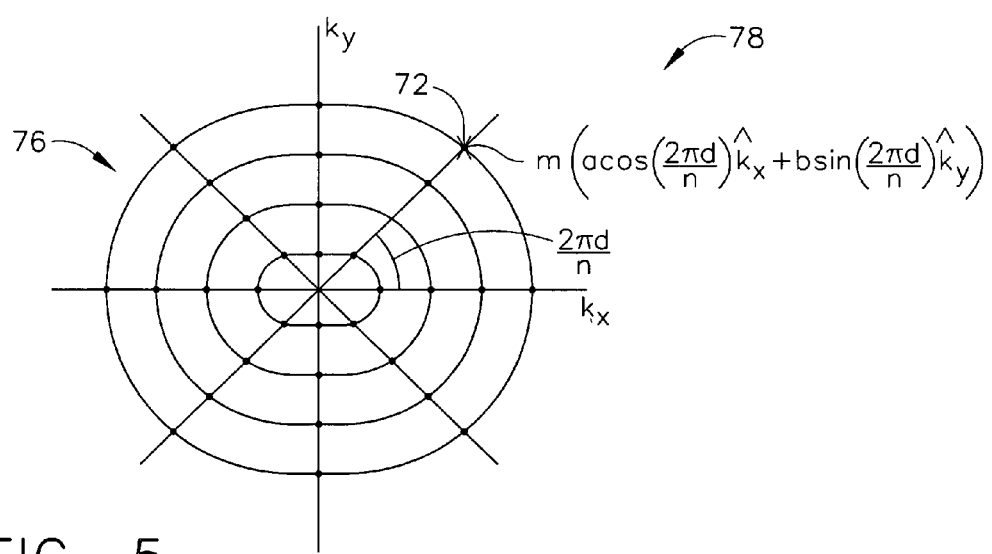
FIG. 5 illustrates an alternative embodiment of a method for polar phase encode placement illustrated as a 2D cross section of FIG. 4 with phase encodings falling on a polar grid <a,b,n> in polar coordinates of k-space and phase encode locations <m,d> on the grid.

FIGS. 4 and 5 illustrate an embodiment of a method for polar phase encode placement in the k-space, having the $k_x$ axis, the $k_y$ axis, and the $k_z$ axis. The method is executed by computer 12. Datasets having data 64, 66, 68, 70, and 72 are collected by phase encoding in x and y directions and by frequency encoding in z direction. For example, information produced by spins of nuclei in a leg of patient 135 is collected by phase encoding in right/left (r/l) and anterior/posterior (a/p) directions, and frequency encoding in sagital/inverse sagital (S/I) direction. In all embodiments described herein, datasets are frequency encoded in z direction. Therefore, FIGS. 4-12 display only a 2-dimensional (2D) cross section of a 3D method of k-space encoding and sampling. The method includes phase encoding on to a grid 76 of polar coordinates 78 in the k-space to generate MR signals that are representative of patient 135 placed under an examination.

Each datum in a dataset that is polar phase encoded is a sample from a location $m(a \cos(2\pi d/n)k_x + b \sin(2\pi d/n)k_y) + ick_z$, in k-space where a, b, c, and d are real numbers, m, n, and i are an integers, $k_x$, $k_y$, and $k_z$ are unit basis vectors for the k-space, <a, b, c> determines a specific polar grid, and <m,d,i> determines a point on the grid where m is a radial parameter of a phase encode, d is a rotational parameter of a phase encode, and i is a parameter of a frequency encode.

Grid 76 is represented as <a,b,c,n>, a datum on the grid is represented as <m,d,i>, and a grid and a datum on the grid together specify a point in the k-space. In an alternative embodiment, each datum in a dataset that is sampled using the method is represented as $(m+0.5)(a \cos(2\pi d/n)k_x + b \sin(2\pi d/n)k_y) + (i+0.5)ck_z$. Although grid 76 is shown to be elliptical in shape, examples of other shapes of grid include a circular-shaped grid.

In an embodiment, the method uses a polar grid <a,b,c,n> and frequency encodes datasets $n_1$ times along $k_z$ axis by keeping m and d constant, and varying i. An example of $n_1$ is 256. For every $n_1$ number of times of frequency encoding, the method includes phase encoding radially once by keeping d constant and varying m. The method includes phase encoding radially for $n_2$ number of times and for each time of radial phase encoding, the frequency encoding is performed for $n_1$ times. An example of $n_2$ is 256. For every $n_2$ number of times of phase encoding radially, the method includes phase encoding rotationally once by varying d. The method includes phase encoding rotationally for $n_3$ number of times and for each time of rotational phase encoding, the radial phase encoding is performed for $n_2$ times. An example of $n_3$ is 128. In essence, the method forms a nested loop of frequency encoding within radial phase encoding within rotational phase encoding.

In an alternative embodiment, the method includes forming a nested loop of frequency encoding within rotational phase encoding within radial phase encoding. It is noted that the methods that are described using FIGS. 4 and 5 and the following FIGS. 6-12 are implemented in a pure polar coordinate system and methods that are described using FIG. 13 are implemented in an extended polar coordinate system. Hence, "polar coordinate system" in general refers to either a pure polar coordinate system or an extended polar coordinate system based on whether the methods illustrated by FIGS. 4-13 are being described or whether the methods illustrated by FIG. 13 are being described.

Figure 6:
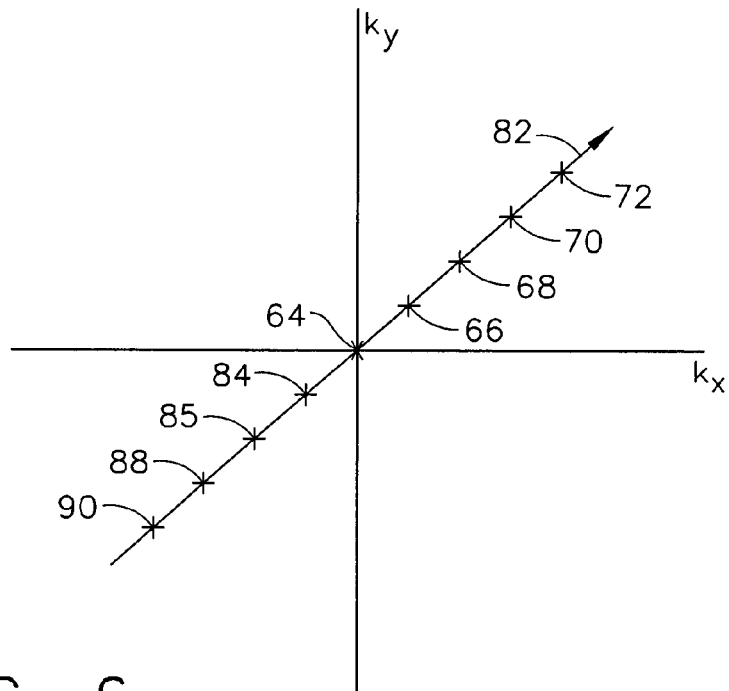
FIG. 6 illustrates yet another alternative embodiment of a method for polar phase encode placement in the k-space for reconstruction as 2-dimensional (2D) projection images with a high temporal resolution.

FIG. 6 illustrates an alternative embodiment of a method for polar phase encode placement in the k-space. The method includes polar phase encoding to create datasets having data 64, 66, 68, 70, 72, 84, 86, 88, and 90 on a plane 82. The direction in which the datasets are polar phase encoded is shown by an arrow. The method further includes constructing a 2D image from datasets located on plane 82. In one embodiment, a 2D image that corresponds to datasets located on plane 82 is constructed by performing a 2D inverse Fourier transformation, such as a 2D fast Fourier transformation (FFT), of the datasets. The 2D inverse Fourier transformation is combined with re-gridding the datasets on to a grid of Cartesian coordinates.

Figure 7:
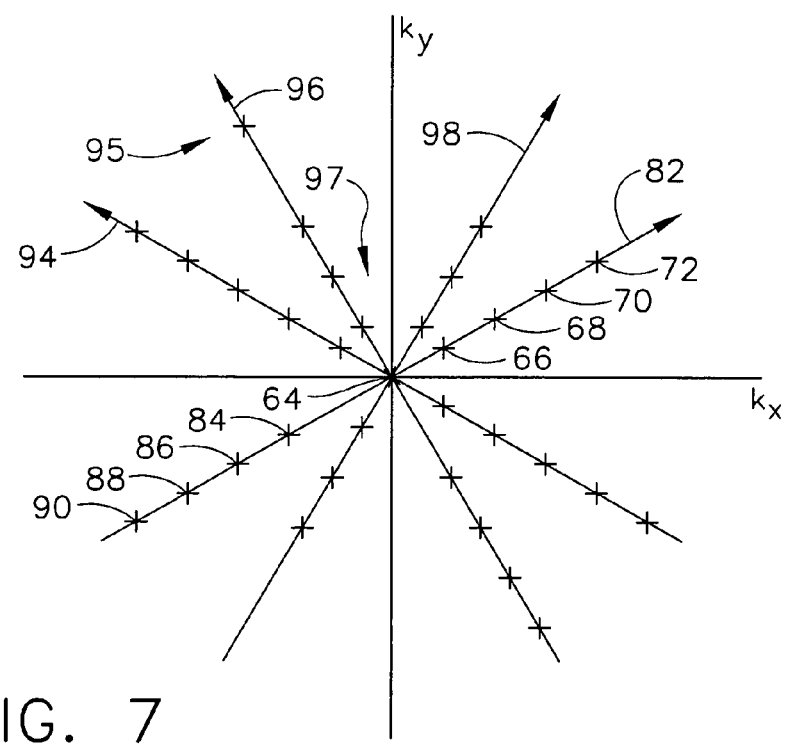
FIG. 7 illustrates yet another alternative embodiment of a method for polar phase encode placement in the k-space for reconstruction as 3-dimensional projection reconstruction (3D PR) images with low temporal resolution.

FIG. 7 illustrates yet another alternative embodiment of a method for polar phase encode placement in the k-space. The method includes polar phase encoding on to planes 82, 94, 96, and 98. For example, plane 82 is formed of 256 phase encodes at a projection angle, plane 94 is formed of 256 phase encodes at another projection angle, and so on until planes 96 and 98 are formed. The direction in which the datasets are polar phase encoded on to planes 82, 94, 96, and 98 is shown by arrows. The method further includes constructing either a 3D image or a time course series of 2D images from datasets located on planes 82, 94, 96, and 98. In one embodiment, a time course series of 2D images that corresponds to datasets located on planes 82, 94, 96, and 98 is constructed by performing a 2D inverse Fourier transformation of the datasets.

For example, a first 2D image that corresponds to datasets located on plane 82 is constructed by performing a 2D inverse Fourier transformation of the datasets. A second 2D image that corresponds to datasets located on plane 94 is constructed by performing a 2D inverse Fourier transformation of the datasets. The 2D inverse Fourier transform is repeated for remaining planes 96 and 98 to form remaining 2D images.

A 3D image can be reconstructed from a 3D data set including datasets located on planes 82, 94, 96, and 98. In an embodiment, the 3D image can be reconstructed by performing an inverse Fourier transformation in $k_z$ direction combined with re-gridding, and performing a 2D inverse Fourier transformation in $k_x$ and $k_y$ directions. In an alternative embodiment, the 3D image can be reconstructed by performing an inverse Fourier transformation in $k_z$ direction, and performing backprojection in $k_x$ and $k_y$ directions.

It is noted that datasets can be sampled on to planes 82, 94, 96, and 98 by a variety of methods including simple phase encoding as described above, Echo-planar imaging (EPI), and spiral imaging to generate the MR signals representative of patient 135. EPI and spiral imaging are faster sampling methods than simple phase encoding. In addition, different orderings of phase encoding can be used such as centric phase encoding and interleaved phase encoding. It is also noted that datasets can be sampled on to more than four planes 82, 94, 96, and 98. For example, datasets are sampled on to 128 planes, where each plane has a different projection angle.

In yet another alternative embodiment, referred to as a "temporal sliding window", the method includes polar phase encoding on to planes 82, 94, 96, and 98, and constructing a 3D image that corresponds to the datasets. The method then includes polar phase encoding on to plane 82 thereby replacing prior datasets on plane 82, and reconstructing a 3D image from the datasets located on planes 82, 94, 96, and 98. Thereafter, the method includes polar phase encoding on to plane 94 thereby replacing prior datasets on plane 94, and reconstructing a 3D image that corresponds to datasets located on planes 82, 94, 96, and 98. The method continues polar phase encoding on to one of planes 82, 94, 96, and 98 and to reconstruct a 3D image corresponding to the datasets located on planes 82, 94, 96, and 98. The method provides a medium temporal resolution of a peripheral region, such as a peripheral region 95 of plane 96. For example, taking 4 seconds, with each second corresponding to each plane 82, 94, 96, and 98, to polar phase encode datasets on to planes 82, 94, 96, and 98 and to construct an image corresponding to the datasets is a medium temporal resolution.

Central region 97 is usually more interesting to medical personnel than peripheral region, such as peripheral region 95 of plane 96. An example of a high temporal resolution of central region 97 is when central region 97 is updated every second. The updating includes polar phase encoding on to one of planes 82, 94, 96, and 98 and to construct an image corresponding to the datasets located on planes 82, 94, 96, and 98. In an alternative embodiment, instead of updating datasets located on any one of planes 82, 94, 96, and 98, datasets located on different kinds of regions shown in FIGS. 8, 10, and 11 below are updated.

Figure 8:
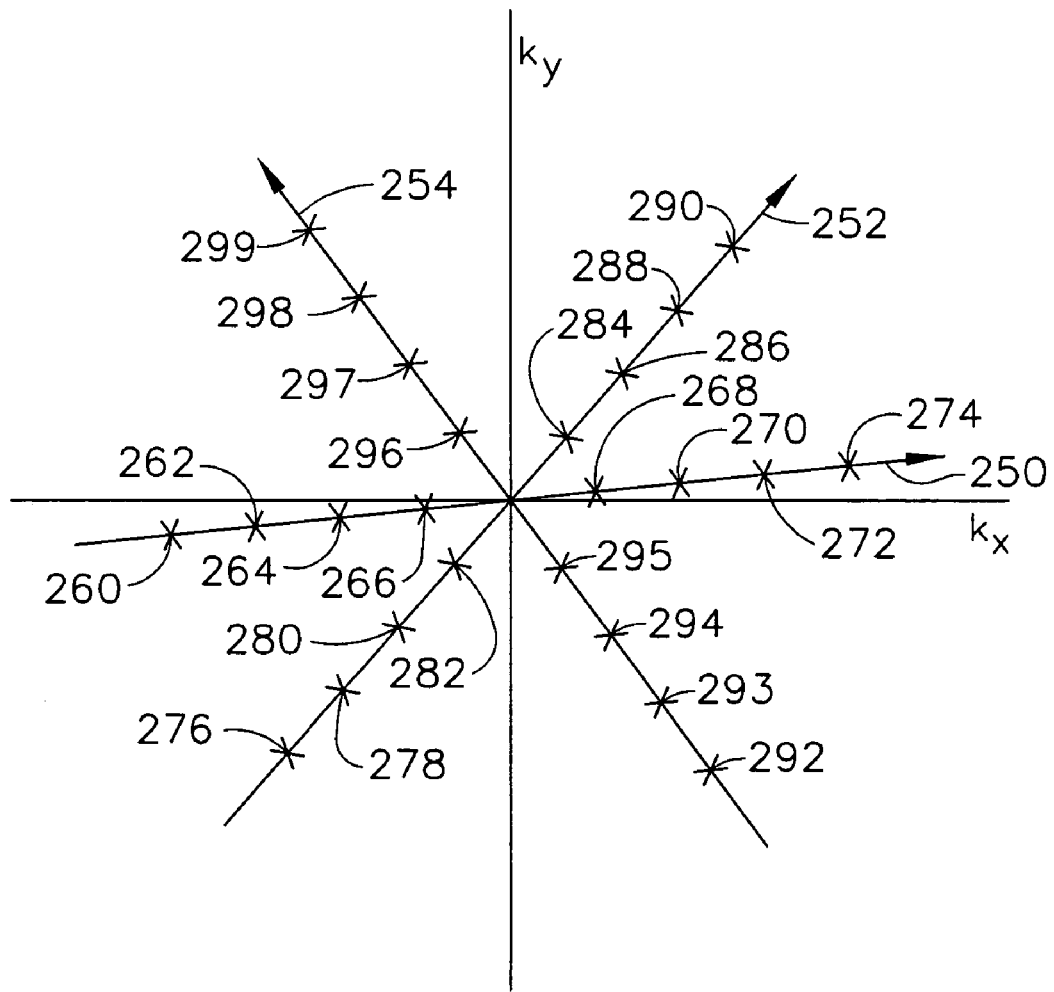
FIG. 8 illustrates an embodiment of a method for polar phase encode placement.

FIG. 8 illustrates an embodiment of a method for polar phase encode placement in the k-space. The method includes polar phase encoding on to a first set of planes 250, 252, and 254. For example, plane 250 is formed of 256 phase encodes at a projection angle, plane 252 is formed of 256 phase encodes at another projection angle of, for example, 60 degrees from plane 250, and plane 254 is formed of 256 phase encodes at yet another projection angle of, for example, 60 degrees from plane 252. Polar phase encoding on to plane 250 creates a dataset having data 260, 262, 264, 266, 268, 270, 272, and 274, polar phase encoding on to plane 252 creates a dataset having data 276, 278, 280, 282, 284, 286, 288, and 290, and polar phase encoding on to plane 254 creates a dataset having data 292, 293, 294, 295, 296, 297, 298, and 299. The direction in which the datasets are polar phase encoded on to planes 250, 252, and 254 is shown by arrows. The method further includes rotating in a counterclockwise direction from planes 250, 252, and 254 by an amount, such as, for example, 5 degrees, and polar phase encoding on to a second set of planes. The method also includes rotating in the counterclockwise direction from the second set of planes by the same amount, such as, for example, 5 degrees, and polar phase encoding on to a third set of planes. The method includes rotating in such as manner to rotate for a total amount of 360 degrees. It is noted that alternatively, the method includes rotating in a clockwise direction instead of the counterclockwise direction.

Figure 9:
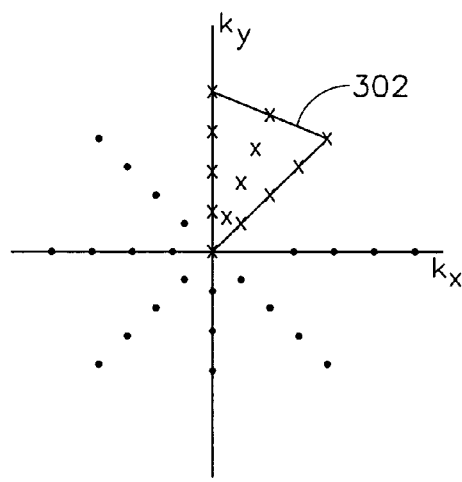
FIGS. 9, 10, 11, and 12 illustrate another alternative embodiment of a method for polar phase encode placement showing flexible k-space sub-sampling for temporal sliding window reconstruction.

FIG. 9 illustrates still another alternative embodiment of a method for polar phase encode placement in the k-space. The method includes polar phase encoding on to a wedge-shaped region 302.

Figure 10:
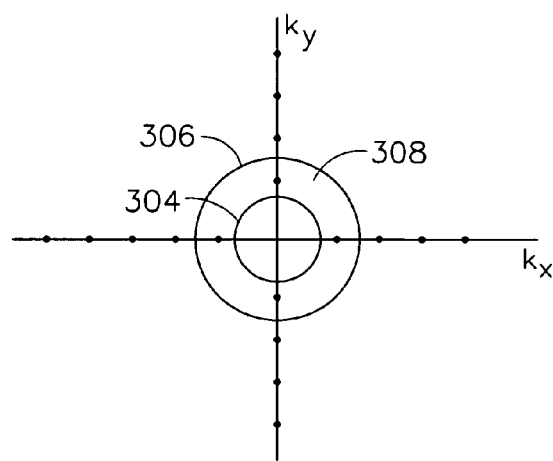
Figure 11:
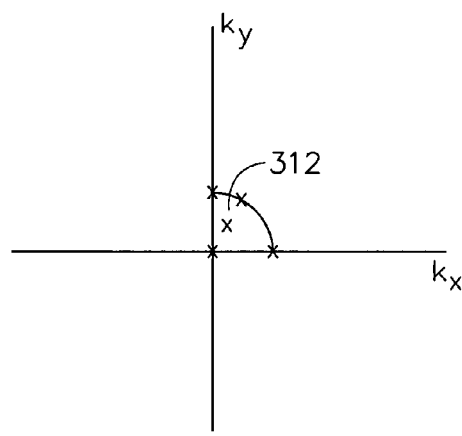

FIGS. 10 and 11 illustrate another alternative embodiment of a method for polar phase encode placement in the k-space. The method includes polar phase encoding on to a region 312 formed by an intersection of cylinder 304 and wedge-shaped region 302. In an alternative embodiment, the method includes polar phase encoding on to a region formed by a union of cylinder 304 and wedge-shaped region 302. It should be noted that the k-space can have a higher or a lower number of concentric cylinders than two cylinders 304 and 308.

Figure 12:
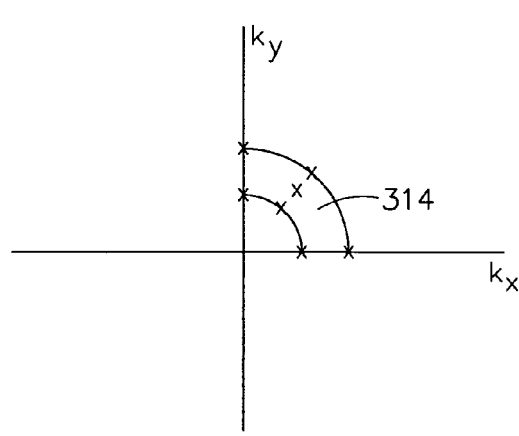
Figure 13:
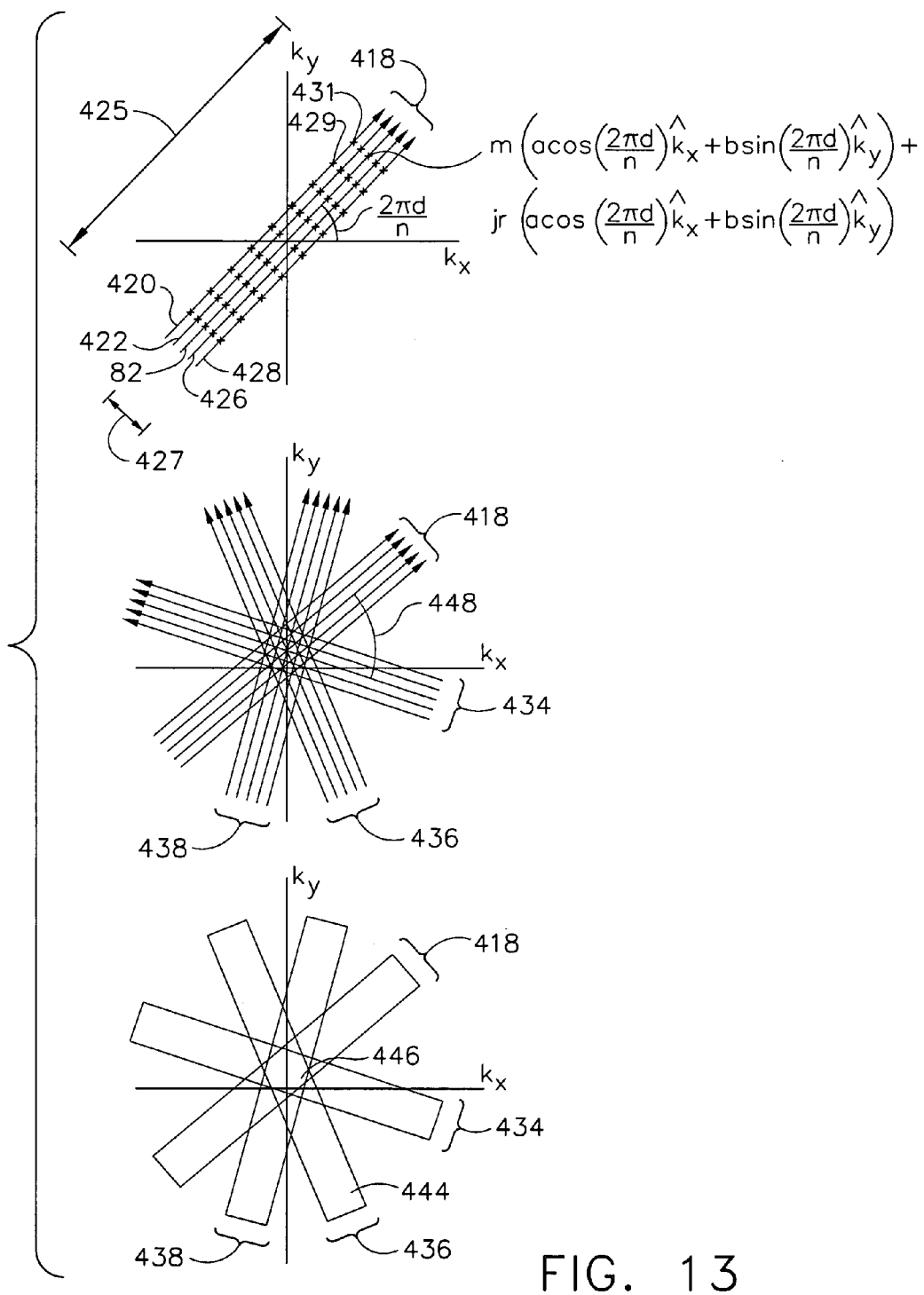
FIG. 13 illustrates another alternative embodiment of a method for generalized polar phase encode placement illustrated as a 2D cross section with phase encodings falling a generalized polar grid <a,b,r,n> in generalized polar coordinates of k-space and phase encode locations <m,j,d> on the generalized grid.

FIG. 12 illustrates still another alternative embodiment of a method for polar phase encode placement in the k-space. The method includes polar phase encoding on to a region 314 formed by an intersection of a region 308 between cylinders 304 and 308 and wedge-shaped region 302. In an alternative embodiment, the method include polar phase encoding on to a region formed by a union of region 314 and wedge-shaped region 302.

FIG. 13 illustrates another embodiment of a method for polar phase encode placement in the k-space. The method extends the method of FIG. 7 from plane 82 parallel to $k_z$ axis to a set of parallel planes 420, 422, 82, 426, and 428 parallel to $k_z$ axis. The method includes sampling datasets on to each plane 420, 422, 82, 426, and 428 in the k-space. Direction in which datasets are sampled on to planes 420, 422, 82, 426, and 428 is shown by direction of arrows. Planes 420, 422, 82, 426, and 428 form a group 418 or a slab 418. Each plane 420, 422, 82, 426, and 428 encompass a finite region in the k-space. For example, each plane 420, 422, 82, 426, and 428 is of a shape of a rectangle. As another example, each 420, 422, 82, 426, and 428 is of a shape of a square. The shape of a plane corresponds to datasets sampled on to the plane. Moreover, the method of FIG. 13 is implemented in an extended polar co-ordinate system as compared to a pure polar co-ordinate system that is used to implement the methods described in FIGS. 4-12.

Each datum in a dataset that is generalized polar phase encoded is a sample from a location $m(a\ \cos(2\pi d/n)k_x + b\ \sin(2\pi d/n)k_y) + jr(a\ \cos(2\pi d/n)k_x + b\ \sin(2\pi d/n)k_y) + ick_z$, in k-space where a, b, c, d, and r are real numbers, m, j, n, and i are an integers, $k_x$, $k_y$, and $k_z$ are unit basis vectors for the k-space, <a, b, c, r> determines a specific generalized polar grid, and <m,d,i,j> determines a point on the generalized grid where m is a radial parameter of a phase encode, d is a rotational parameter of a phase encode, j is a translational parameter of a phase encode and i is a parameter of a frequency encode.

A generalized grid is represented as <a,b,c,r,n>, a datum on the generalized grid is represented as <m,d,i,j>, and a grid and a datum on the grid together specify a point in the k-space. As an example, datasets having data 429 and 431, both of which are sampled on to plane 420 are represented as m(a cos(2πd/n)k$_x$+b sin(2πd/n)k$_y$)+jr(a cos(2πd/n)k$_x$+b sin(2πd/n)k$_y$).

In an embodiment, the method includes frequency encoding datasets m$_1$ times along k$_z$ axis by keeping m, a, d, n, b, j, r, and c constant, and varying i. An example of m$_1$ is 256. For every m$_1$ number of times of frequency encoding, the method includes phase encoding radially once by keeping a, d, n, b, j, r, and c constant and varying m. The method includes phase encoding radially for m$_2$ number of times and for each time of radial phase encoding, frequency encoding is performed for m$_1$ times. An example of m$_2$ is 256. For every m$_2$ number of times of radial phase encoding, the method includes phase encoding translationally once by keeping a, d, n, b, r, and c constant and varying j. The method includes phase encoding translationally for m$_3$ number of times and for each time of translational phase encoding, radial phase encoding is performed for m$_2$ times. An example of m$_3$ is 6. For every m$_3$ number of times of translational phase encoding, the method includes phase encoding rotationally once by keeping a, n, b, r, and c constant and varying d. The method includes phase encoding rotationally for m$_4$ number of times and for each time of rotational phase encoding, translational phase encoding is performed for m$_3$ times. An example of m$_4$ is 31. In essence, the method forms a nested loop of frequency encoding within radial phase encoding within translational phase encoding within rotational phase encoding.

Each group 434, 436, and 438 is similar to group 418 since each group 434, 436, and 438 is a stack of planes similar to planes 420, 422, 82, 426, and 428. Directions in which datasets are sampled on to groups 418, 434, 436, and 438 is shown by arrows. There is an angle between any two groups. Angle 448 is an angle between group 418 and group 434. An example of angle 448 is an angle between 1 degree and 359 degrees. Another example of angle 448 is 5 degrees. Another example of angle 448 is 15 degrees.

In an alternative embodiment, the method includes sampling datasets on to a first set of regions formed by intersection of planes 420, 422, 82, 426, and 428 of group 418 with concentric cylinders 304 and 306 in the k-space. In yet another alternative embodiment, the method includes sampling datasets on to a second set of regions formed by intersection of groups 418, 434, 436, and 438 with cylinders 304 and 306. In still another alternative embodiment, the method includes sampling datasets on to a third set of regions formed by intersection of planes 420, 422, 82, 426, and 428 with group 434, the first set of regions, and the second set of regions. In another alternative embodiment, the method includes sampling datasets on to a fourth set of regions (not shown) formed by union of planes 420, 422, 82, 426, and 428 with group 434, the first set of regions, and the second set of regions.

It should be noted that datasets can be sampled on to a higher or a lower number of planes than six planes of group 418. Similarly, the number of planes in remaining groups 434, 436, and 438 can vary. It should also be noted that datasets can be sampled on to a higher or a lower number of groups of planes than four groups 418, 434, 436, and 438.

It should be noted that polar and generalized phase encoding can be combined with continuous and non-continuous moving table imaging and bolus tracking.

It should also be noted that number of planes within at least one of groups 418, 434, 436, and 438 may change as a scan progresses and that number of groups, i.e., projection angles, may change as the scan progresses. These changes may be made to accommodate changing temporal dynamics or changes in a region of an object being scanned or changes in the object itself.

Order of construction of an image from datasets in each group 418, 434, 436, and 438 depends on a desired temporal resolution, a desired spatial resolution in k$_x$ direction, and a desired spatial resolution in k$_y$ direction. The desired temporal resolution, desired spatial resolution in k$_x$ direction, and desired spatial resolution in k$_y$ direction depends on various factors including a type of imaging system used to scan patient 135, whether a contrast agent is administered in patient 135, and whether a size of a body part of patient 135 to be scanned is large or small. For example, if a contrast agent is administered into patient 135, a high temporal resolution and a low or a medium spatial resolution are desired. In the example, a high temporal resolution and a low or a medium spatial resolution are desired since images of patient 135 should be obtained at or close to a moment when the contrast agent flows through an internal part, such as, for instance, an artery of patient 135. As another example, if a body part, such as a leg, of a large size of patient 135 is to be scanned, a low temporal resolution and a high spatial resolution are desired. In the other example, a low temporal resolution and a high spatial resolution are desired since such a combination of resolutions enables a user to visualize a small internal part, such as a vein, within the large body part. In all embodiments of a method for polar phase encode placement, there is a high spatial resolution in k$_z$ direction. As an example, a high spatial resolution in k$_z$ direction is achieved by frequency encoding 256 datapoints in k$_z$ direction.

In an embodiment, to provide a high temporal resolution, a high in-plane resolution and no thru-plane resolution, a 2D image that corresponds to datasets located on plane 420 of group 118 is constructed by re-gridding the datasets and performing a 2D inverse Fourier transformation, such as a 2D fast Fourier transformation (FFT), of the datasets. The 2D inverse Fourier transformation is combined with re-gridding the datasets on to a grid of cartesian coordinates. The re-gridding on to the grid of Cartesian coordinates and the 2D inverse Fourier transform are performed after sampling datasets on to plane 420. In an alternative embodiment, to provide a high temporal resolution, a high in-plane resolution, and no thru-plane resolution, a 2D image that corresponds to datasets located on plane 420 of group 118 is constructed by performing a 2D backprojection of the datasets combined with re-gridding the datasets on to grid 76 of polar coordinates 78. An example of high temporal resolution is taking 1 second to sample datasets on to plane 420 and to construct an image corresponding to the datasets.

The length of each group 418, 434, 436, and 438 corresponds to in-plane resolution, which is the desired spatial resolution in k$_y$ direction, and the depth of each group 418, 434, 436, and 438 corresponds to thru-plane resolution, which is the desired spatial resolution in k$_x$ direction. For example, to obtain a high in-plane resolution, length 425 of group 418 corresponds to a dataset having 256 datapoints in k$_y$ direction. As another example, to obtain a low in-plane resolution, length 425 of group 418 corresponds to a dataset having a datum in k$_y$ direction. Medium in-plane resolution is a resolution between high and low in-plane resolutions. As yet another example, to obtain a low thru-plane resolution, depth 427 of group 418 corresponds to a dataset having a datum in k$_x$ direction. As still another example, to obtain a high thru-plane resolution, depth 427 of group 418 corresponds to a dataset having 256 datapoints in $k_x$ direction. Medium thru-plane resolution is a resolution between high and low thru-plane resolutions. As an example, to obtain a medium thru-plane resolution, depth 427 of group 418 corresponds to a dataset having 6 datapoints in $k_x$ direction.

In yet another alternative embodiment, to provide a low temporal resolution, and a full 3D resolution, a 3-dimensional (3D) image that corresponds to datasets located on groups 418, 434, 436, and 438 is constructed by performing an inverse Fourier transformation in $k_z$ direction combined with re-gridding, and performing a 2D inverse Fourier transformation in $k_x$ and $k_y$ directions. The full 3D resolution is a high spatial resolution in $k_x$ direction, a high spatial resolution in $k_y$ direction, and a high spatial resolution in $k_z$ direction. In still another alternative embodiment, to provide a low temporal resolution and the full 3D resolution, a 3D image that corresponds to datasets located on groups 418, 434, 436, and 438 is reconstructed by performing an inverse Fourier transformation in $k_z$ direction, and performing backprojection in $k_x$ and $k_y$ directions. There is a low temporal resolution since a 3D image is constructed after sampling datasets on to groups 418, 434, 436, and 438, and after reconstructing the datasets. For example, taking 36 seconds, with each second corresponding to each plane of each group 418, 434, 436, and 438 to sample datasets on to groups 418, 434, 436, and 438, and to construct an image corresponding to the datasets is a low temporal resolution.

In another alternative embodiment, to provide a medium temporal resolution, a medium spatial resolution in $k_x$ direction, and a high spatial resolution in $k_y$ direction, a 2D image that corresponds to datasets located on group 434 is constructed by performing a 3D inverse Fourier transformation of the datasets, and performing a maximum intensity projection (MIP) of the datasets. The 3D inverse Fourier transform is performed after sampling datasets on to group 434. In yet another alternative embodiment, to provide a medium temporal resolution, a medium spatial resolution in $k_x$ direction, and a high spatial resolution in $k_y$ direction, a 2D image that corresponds to datasets located on group 434 is constructed by performing a 3D backprojection of the datasets and performing an MIP of the datasets. The 3D backprojection is performed after sampling the datasets on to group 434. The medium temporal resolution is a temporal resolution that is higher than the low temporal resolution and lower than the high temporal resolution. The medium temporal resolution is higher than the low temporal resolution since a 2D image of datasets located on more than a single plane is constructed. The medium temporal resolution is lower than the high temporal resolution since a 2D image is constructed of datasets located on a lower number of groups than four groups 418, 434, 436, and 438. The medium spatial resolution in $k_x$ direction is a spatial resolution that is higher than the low spatial resolution in $k_x$ direction and lower than the high spatial resolution in $k_x$ direction. The medium spatial resolution in $k_x$ direction is higher than the low spatial resolution in $k_x$ direction since the MIP accounts for more than one datum in $k_x$ direction, for instance, by averaging more than one datum in $k_x$ direction or by taking a datum with maximum intensity from multiple datapoints in $k_x$ direction. The medium spatial resolution in $k_x$ direction is lower than the high spatial resolution in $k_x$ direction since a shorter length of datapoints in $k_x$ direction is used to construct a 2D image than a length of datapoints in $k_x$ direction of groups 418, 434, 436, and 438. It is noted that unlike in a cartesian co-ordinate system, in the embodiments of a method for polar phase encode placement described above, spatial resolution is not dependent primarily on the number of planes on to which datasets are polar phase encoded but is dependent primarily on the number of datasets located on a plane.

In another alternative embodiment, also termed as a "temporal sliding window", to provide a medium temporal resolution of a central region 446 formed by intersection of groups 418, 434, 436, and 438, the method includes sampling datasets on to groups 418, 434, 436, and 438, and constructing a 3D image that corresponds to the datasets. The method further includes sampling datasets on to group 418 and reconstructing a 3D image that corresponds to the datasets located on groups 418, 434, 436, and 438. The method also includes sampling datasets on to group 434 and reconstructing a 3D image that corresponds to datasets located on groups 418, 434, 436, and 438, and so on without following any particular order of sampling datasets on to one of groups 418, 434, 436, and 438. The method provides a low temporal resolution of a peripheral region, such as a peripheral region 444, of any of groups 418, 434, 436, and 438. Although there is a low temporal resolution of a peripheral region, such as peripheral region 444, there is medium temporal resolution of central region 446 and central region 446 is usually more interesting to medical personnel than a peripheral region.

It should be noted that in an alternative embodiment, once datasets are sampled, phase and frequency correction in datasets are obtained by periodically sampling on to a center line of the k-space. In another alternative embodiment, axial plane motion correction is obtained by periodically sampling datasets on to an inner cylinder that is surrounded by one or more cylinders in the k-space. In yet another alternative embodiment, Hermetian symmetry is used to infer full datasets from partially sampled datasets. In still another alternative embodiment, datasets are sampled on to every alternate plane of a group. For example, datasets are sampled on to planes of group before sampling datasets on to planes of group. In an alternative embodiment, multiple phase encodes are sampled in a single TR by EPI or gradient recall and spin echo (GRASE).

Thus, the herein described systems and methods for polar phase encode placement provide the desired temporal resolution and the desired spatial resolution in $k_x$ direction, and the desired spatial resolution in $k_y$ direction. The herein described systems and methods for polar encode placement provide the desired temporal resolution, the desired spatial resolution in $k_x$ direction, and the desired spatial resolution in $k_y$ direction by sampling datasets on to a grid of polar coordinates, inverse Fourier transformation, backprojection, and MIP.

While the invention has been described in terms of various specific embodiments, those skilled in the art will recognize that the invention can be practiced with modification within the spirit and scope of the claims.

What is claimed is:

1. A method for a medical examination using a magnetic resonance imaging (MRI) machine having an object positioned therein, said method comprising:

polar phase encoding to generate a plurality of signals forming datasets representative of the object by frequency encoding in a Z-direction of a k-space, wherein the datasets form an elliptical grid in polar coordinates in the k-space, the Z-direction substantially parallel to a center axis of the elliptical grid, wherein said phase encoding comprises phase encoding in which each datum is represented as m(a cos(2πd/n)kx+b sin(2πnd/n)ky+ickz, a, b, c, and d are real numbers, m, n, and i are an integers, and kx, ky, and kz being unit basis vectors in the k-space;

forming a nested loop by:
  frequency encoding n1 times along a kz axis by keeping m, a, d, b, n, and c constant, and varying i;
  phase encoding radially once by keeping a, d, b, n, and c constant and varying m for every n1 number of times of frequency encoding;
  phase encoding radially for n2 number of times;
  phase encoding rotationally once by keeping a, b, n, and c constant and varying d for every n2 number of times of radial phase encoding; and
  phase encoding rotationally for n3 number of times; and
outputting an image of the object generated using the datasets.

2. A method in accordance with claim 1 wherein said phase encoding comprises phase encoding on to the elliptical grid in polar coordinates in the k-space to generate magnetic resonance signals representative of the object.

3. A method in accordance with claim 1 wherein said phase encoding comprises phase encoding on to at least one plane encompassing a finite region in the k-space, each plane passing through a kz axis of the k-space.

4. A method in accordance with claim 1 wherein said phase encoding comprises phase encoding on to at least one of:
  planes in the k-space;
  groups of planes in the k-space;
  a first set of regions formed by intersection of the planes with cylinders in the k-space;
  a second set of regions formed by intersection of groups of planes with the cylinders;
  a third set of regions formed by intersection of the planes with the groups of planes, the first set of regions, and the second set of regions; and
  a fourth set of regions formed by union of the planes with the groups of planes, the first set of regions, and the second set of regions, wherein each of the planes and each plane in the groups of planes encompassing a finite region in the k-space, each of the planes being parallel to each other, each plane in each group being parallel to any other plane in the group, and each group being at an angle to any other group.

5. A method in accordance with claim 1 wherein said phase encoding comprises phase encoding on to a plane in the k-space.

6. A method in accordance with claim 5 wherein outputting an image of the object further comprises constructing a 2-dimensional (2D) image by performing a 2D inverse Fourier transformation of the datasets.

7. A method in accordance with claim 5 wherein outputting an image of the object further comprises constructing a 2-dimensional (2D) image by:
  re-gridding datasets located on the plane on to a grid of Cartesian coordinates; and
  performing a 2-dimensional backprojection of datasets located on the plane.

8. A method in accordance with claim 1 wherein said phase encoding comprises phase encoding on to a series of groups of planes in the k-space, wherein each group is at an angle relative to any other group in the series.

9. A method in accordance with claim 8 wherein outputting an image of the object further comprises constructing a 3-dimensional (3D) image by:
  performing an inverse Fourier transformation, in kz direction, of datasets located on each group in the series; and
  performing a 2-dimensional (2D) inverse Fourier transformation, in kx and ky directions, of datasets located on each group in the series.

10. A method in accordance with claim 8 wherein outputting an image of the object further comprises constructing a 3-dimensional (3D) image by:
  performing an inverse Fourier transformation, in kz direction, of datasets located on each group in the series; and
  performing a 2-dimensional backprojection, along kx and ky directions, of datasets located on each group in the series.

11. A method in accordance with claim 8 further comprising obtaining a high temporal resolution by performing a 2-dimensional inverse Fourier transformation of datasets located on a plane of a group in the series.

12. A method in accordance with claim 8 further comprising obtaining a high temporal resolution by:
  re-gridding datasets located on a plane of a group in the series, wherein the re-gridding is performed on a grid of polar coordinates; and
  performing a 2-dimensional backprojection of datasets located on the plane of the group.

13. A method in accordance with claim 8 further comprising obtaining a low temporal resolution by:
  performing an inverse Fourier transformation in kz direction of datasets located on each groups in the series;
  re-gridding datasets located on each group in the series, wherein the re-gridding is performed along kx and ky directions; and
  performing a 2-dimensional inverse Fourier transformation in kx and ky directions of datasets located each group in the series.

14. A method in accordance with claim 8 further comprising obtaining a low temporal resolution by:
  performing an inverse Fourier transformation in kz direction of datasets located on each group in the series; and
  performing backprojection in kx and ky directions of datasets located on each group in the series.

15. A method in accordance with claim 8 further comprising obtaining a medium temporal resolution by:
  performing a 3-dimensional inverse Fourier transformation of datasets located on a group in the series;
  performing a maximum intensity projection of datasets located on the group in the series.

16. A method in accordance with claim 8 further comprising obtaining a medium temporal resolution by performing a 3-dimensional backprojection of datasets located on a group in the series.

17. A method in accordance with claim 16 further comprising performing a maximum intensity projection of datasets located on the group.

18. A method in accordance with claim 8 further comprising:
  constructing a 3-dimensional (3D) image from datasets located each group in the series; and
  updating the 3D image by:
    phase encoding on to a first group in the series;
    constructing a 3D image from datasets located on each group in the series after phase encoding on to the first group;
    phase encoding on to a second group in the series;
    constructing a 3D image from datasets located on each group in the series after phase encoding on to the second group;
    phase encoding on to a third group in the series; and
    constructing a 3D image from datasets located on each group in the series after phase encoding on to the third group.

19. A method in accordance with claim 1 wherein said phase encoding comprises phase encoding on to a group of planes in the k-space, each plane in the group being parallel to any other plane in the group.

20. A method in accordance with claim 1 wherein each datum of the datasets is represented as a function of at least one of a cosine function and a sine function.

21. A method in accordance with claim 1 wherein at least a portion of the datasets is acquired along a radius.

22. A magnetic resonance (MR) method for medical examinations using a magnetic resonance imaging (MRI) machine, said method comprising:
  injecting a patient with a contrast agent that flows into a vasculature of the patient;
  acquiring MR signals produced by spins in the vasculature from an MR imaging system;
  polar phase encoding to generate the MR signals forming datasets representative of the patient by frequency encoding in a Z-direction of a k-space, wherein the datasets form an elliptical grid in polar coordinates in the k-space, the Z-direction substantially parallel to a center axis of the elliptical grid, wherein said polar phase encoding comprises phase encoding in which each datum is represented as $m(a \cos(2\pi d/n)kx + b \sin(2\pi d/n)ky) + jr(a \cos(2\pi d/n)kx + b \sin(2\pi d/n)ky) + ickz$, a, b, c, d, and r are real numbers, m, j, n, and i are an integers, and kx, ky, and kz being unit vectors in the k-space;
  forming a nested loop by:
    frequency encoding the datasets m1 times along a kz axis by keeping m, a, d, n, b, j, r, and c constant, and varying i;
    phase encoding radially once by keeping a, d, n, b, j, r, and c constant and varying m for every m1 number of times of frequency encoding;
    phase encoding radially for m2 number of times;
    phase encoding translationally once by keeping a, d, n, b, r, and c constant and varying j for every m2 number of times of radial phase encoding;
    phase encoding translationally for m3 number of times;
    phase encoding rotationally once by keeping a, n, b, r, and e constant and varying d for every m3 number of times of translational phase encoding; and
    phase encoding rotationally for m4 number of times; and
  outputting an image of the patent generated using the datasets.

23. A method for a medical examination using a magnetic resonance imaging (MRI) machine having an object of interest that is being medically examined positioned therein, said method comprising:
  sampling datasets on to an elliptical grid in polar coordinates in a k-space to generate signals representative of the object of interest, wherein the dataset are frequency encoded in a Z-direction of the k-space, the Z-direction substantially parallel to a center axis of the elliptical grid, said sampling comprises phase encoding in which each datum is represented as $m(a \cos(2\pi d/n)kx + b \sin(2\pi d/n)ky) + ickz$, a, b, c, and d are real numbers, m, n, and i are an integers, and kx, ky, and kz being unit basis vectors in the k-space;
  forming a nested loop by:
    frequency encoding n1 times along a kz axis by keeping m, a, d, b, n, and c constant, and varying i;
    phase encoding radially once by keeping a, d, b, n, and c constant and varying m for every n1 number of times of frequency encoding;
    phase encoding radially for n2 number of times;
    phase encoding rotationally once by keeping a, b, n, and c constant and varying d for every n2 number of times of radial phase encoding; and
    phase encoding rotationally for n3 number of times; and
  outputting an image of the object of interest generated using the datasets.

24. A magnetic resonance imaging (MRI) system comprising:
  a main magnet configured to generate a uniform magnetic field;
  a radio frequency pulse generator configured to excite the magnetic field;
  a gradient field generator configured to generate gradients extending in different directions in the magnetic field;
  a receiver configured to receive magnetic resonance (MR) signals representative of an object; and
  a controller configured to polar phase encode to generate the MR signals forming datasets representative of the object by frequency encoding in a Z-direction of a k-space, wherein the datasets form an elliptical grid in polar coordinates in the k-space, the Z-direction substantially parallel to a center axis of the elliptical grid, said controller further configured to:
    phase encoding by representing each datum as $m(a \cos(2\pi d/n)kx + b \sin(2\pi d/n)ky) + ickz$, a, b, c, and d are real numbers, m, n, and i are an integers, and kx, ky, and kz being unit basis vectors in the k-space; and
    form a nested loop by:
      frequency encoding n1 times along a kz axis by keeping m, a, d, b, n, and c constant, and varying i;
      phase encoding radially once by keeping a, d, b, n, and c constant and varying m for every n1 number of times of frequency encoding;
      phase encoding radially for n2 number of times;
      phase encoding rotationally once by keeping a, b, n, and c constant and varying d for every n2 number of times of radial phase encoding; and
      phase encoding rotationally for n3 number of times.

25. A magnetic resonance (MR) controller electrically coupled to a magnetic resonance imaging (MRI) machine having an object positioned therein, said controller configured to:
  polar phase encode to generate a plurality of magnetic resonance (MR) signals forming datasets representative of the object by frequency encoding in a Z-direction of a k-space, wherein the datasets form an elliptical grid in polar coordinates in the k-space, the Z-direction substantially parallel to a center axis of the elliptical grid, wherein said polar phase encoding comprises phase encoding in which each datum is represented as $m(a \cos(2\pi d/n)kx + b \sin(2\pi d/n)ky) + jr(a \cos(2\pi d/n)kx + b \sin(2\pi d/n)ky) + ickz$, a, b, c, d, and r are real numbers, m, j, n, and i are an integers, and kx, ky, and kz being unit vectors in the k-space;
  form a nested loop by:
    frequency encoding the datasets m1 times along a kz axis by keeping m, a, d, n, b, j, r, and c constant, and varying i;
    phase encoding radially once by keeping a, d, n, b, j, r, and c constant and varying m for every ml number of times of frequency encoding;
    phase encoding radially for m2 number of times;
    phase encoding translationally once by keeping a, d, n, b, r, and c constant and varying j for every m2 number of times of radial phase encoding;
    phase encoding translationally for m3 number of times;
    phase encoding rotationally once by keeping a, n, b, r, and c constant and varying d for every m3 number of times of translational phase encoding; and
    phase encoding rotationally for m4 number of times; and
  output an image of the object generated from the datasets.

* * * * *

UNITED STATES PATENT AND TRADEMARK OFFICE
CERTIFICATE OF CORRECTION

PATENT NO. : 7,603,156 B2 Page 1 of 1
APPLICATION NO. : 10/613580
DATED : October 13, 2009
INVENTOR(S) : Gurr et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1203 days.

Signed and Sealed this

Fifth Day of October, 2010

David J. Kappos
*Director of the United States Patent and Trademark Office*